US012695127B2

(12) United States Patent
Nam et al.

(10) Patent No.: US 12,695,127 B2
(45) Date of Patent: Jul. 28, 2026

(54) SYSTEM AND METHOD FOR ESTIMATING BATTERY CELL SURFACE TEMPERATURE

(71) Applicant: LG ENERGY SOLUTION, LTD., Seoul (KR)

(72) Inventors: Ho Chol Nam, Daejeon (KR); Seog Jin Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 1000 days.

(21) Appl. No.: 17/793,532

(22) PCT Filed: Jun. 11, 2021

(86) PCT No.: PCT/KR2021/007364
§ 371 (c)(1),
(2) Date: Jul. 18, 2022

(87) PCT Pub. No.: WO2021/256791
PCT Pub. Date: Dec. 23, 2021

(65) Prior Publication Data
US 2023/0037677 A1 Feb. 9, 2023

(30) Foreign Application Priority Data
Jun. 17, 2020 (KR) ........................ 10-2020-0073636

(51) Int. Cl.
H01M 10/48 (2006.01)
G01R 31/28 (2006.01)
(Continued)

(52) U.S. Cl.
CPC ...... H01M 10/486 (2013.01); G01R 31/3648 (2013.01); G01R 31/396 (2019.01);
(Continued)

(58) Field of Classification Search
CPC ............ G01K 2217/00; G01R 31/3648; G01R 31/396; G01R 31/2872; G01R 31/2874;
(Continued)

(56) References Cited

U.S. PATENT DOCUMENTS

2009/0099800 A1 4/2009 Ishishita
2016/0329612 A1 11/2016 Jung
(Continued)

FOREIGN PATENT DOCUMENTS

CN 109947148 A 6/2019
JP 2005331484 A * 12/2005
(Continued)

OTHER PUBLICATIONS

International Search Report (PCT/IS/210) issued in PCT/KR2021/007364, dated Sep. 29, 2021.

*Primary Examiner* — Julian D Huffman
*Assistant Examiner* — Nathan J Instone
(74) *Attorney, Agent, or Firm* — Birch, Stewart, Kolasch & Birch, LLP

(57) ABSTRACT

The present invention relates to a battery cell surface temperature estimation system and method capable of minimizing a temperature measurement delay through a software algorithm method that estimates the actual cell surface temperature by reflecting the gradient of the measured temperature change of the battery cell.

11 Claims, 3 Drawing Sheets

(51) Int. Cl.

| | | |
|---|---|---|
| *G01R 31/36* | (2020.01) | |
| *G01R 31/396* | (2019.01) | |
| *H01M 10/0525* | (2010.01) | |
| *H01M 10/42* | (2006.01) | |

(52) U.S. Cl.

CPC ..... *H01M 10/0525* (2013.01); *H01M 10/425* (2013.01); *H01M 10/48* (2013.01); *G01K 2217/00* (2013.01); *G01R 31/2872* (2013.01); *G01R 31/2874* (2013.01); *G01R 31/2891* (2013.01); *H01M 2010/4278* (2013.01); *Y02E 60/10* (2013.01)

(58) Field of Classification Search

CPC .............. G01R 31/2891; H01M 10/48; H01M 10/486; H01M 10/0525; H01M 10/425; H01M 2010/4271; H01M 2010/4278; H01M 10/443; Y02E 60/10

USPC .......................................................... 320/150

See application file for complete search history.

(56) References Cited

U.S. PATENT DOCUMENTS

| | | | |
|---|---|---|---|
| 2017/0012327 A1 | 1/2017 | Mitsuyama et al. | |
| 2019/0096473 A1 | 3/2019 | Park | |
| 2020/0067148 A1 | 2/2020 | Kim et al. | |

FOREIGN PATENT DOCUMENTS

| | | | |
|---|---|---|---|
| JP | 3842075 B2 | | 11/2006 |
| JP | 2008249641 A | * | 10/2008 |
| JP | 4383596 B2 | | 12/2009 |
| JP | WO2011/048632 A1 | | 4/2011 |
| JP | 4929839 B2 | | 5/2012 |
| JP | 2013-5663 A | | 1/2013 |
| JP | 6200359 B2 | | 9/2017 |
| JP | 2018-129130 A | | 8/2018 |
| JP | 2019-100971 A | | 6/2019 |
| KR | 10-1685130 B1 | | 12/2016 |
| KR | 10-2019-0036893 A | | 4/2019 |
| KR | 10-2019-0051482 A | | 5/2019 |

* cited by examiner

MEASUREMENT
CELL SURFACE
TEMPERATURE

ACTUAL
CELL SURFACE
TEMPERATURE

TEMPERATURE

TIME

|  | CHARGE DELAY TIME | DISCHARGE DELAY TIME |
|---|---|---|
| 30 DEGREES | 3 | 3 |
| 40 DEGREES | 8 | 9 |
| 50 DEGREES | 10 | 13 |
| 60 DEGREES | 12 | 15 |

SYSTEM AND METHOD FOR ESTIMATING BATTERY CELL SURFACE TEMPERATURE

TECHNICAL FIELD

The present invention relates to a battery cell surface temperature estimation system and method, and more particularly, to a battery cell surface temperature estimation system and method for minimizing a temperature measurement delay.

BACKGROUND ART

A battery used as an energy source for various portable electronic devices, including smart phones, notebook computers, and PDA's, may have a temperature that rises above a reference temperature by various circumstances such as when a short circuit occurs inside a cell built into a battery, when an electronic device with a battery consumes an abnormally large amount of power, or when an electronic device with a battery is exposed to a high temperature environment, for example.

In this way, when the temperature of the battery rises above the reference temperature, as a large amount of gas is released by the decomposition of the electrolyte or active material built into the battery cell, the internal pressure of the cell rises rapidly, so that there is a problem that not only there is a risk of the cell explosion, but also the electrochemical characteristics of the battery cell are deteriorated, thereby reducing the lifespan of the battery.

In order to solve these problems, when the temperature is measured by contacting the temperature sensor at a specific location of the battery cell and detected above the standard, it was determined that the temperature of the battery cell was abnormal, and measures such as blocking the current of the battery were taken to prevent further temperature rise.

However, the method of measuring the temperature by contacting the temperature sensor with the surface of the battery cell as described above has a problem in that it is measured slower than the actual cell surface temperature when the temperature sensor does not come into close contact with the battery cell due to the limitations of physical device design such as process, or due to time difference due to conduction or convection For example, the cell surface temperature rises due to heat generation during overdischarge, and the temperature value measured by the temperature sensor rises more slowly than the actual cell surface temperature at the time, resulting in a situation in which the measurement time is delayed. In this case, since there is a limit to determining the current temperature of the actual battery cell, as a result, the safety diagnosis determination of the battery cell is delayed. (Patent Document 1) JP2013-005663 A

DISCLOSURE OF THE INVENTION

Technical Problem

The present invention is intended to solve the above-described problem, and to minimize the temperature measurement delay by using a software algorithm method for estimating the current actual cell surface temperature by reflecting the gradient of the measured temperature change of the battery cell.

Technical Solution

A battery cell surface temperature estimation system according to the present invention includes: a temperature measurer configured to measure a surface temperature of a battery cell being charged/discharged at a predetermined cycle interval; a delay time acquirer configured acquire a delay time required for the surface temperature to reach a maximum temperature for each predetermined temperature section from a charge/discharge end time point of the battery cell; a first memory configured to store the delay time corresponding to each charge/discharge state of the battery cell for each predetermined temperature section as a database based on data including the delay time obtained from the delay time acquirer; a second memory configured to store the surface temperature measured by the temperature measurer; and a cell surface temperature predictor configured to calculate a delay time corresponding to the current surface temperature measured by the temperature measurer based on the database of the first memory, and predict an actual cell surface temperature of the battery cell using the calculated delay time.

Specifically, the cell surface temperature predictor includes: a current delay time calculator configured to extract a temperature section to which the surface temperature measured by the temperature measurer belongs from among the predetermined temperature sections stored in the first memory, and calculate a delay time corresponding to the surface temperature by using a temperature value corresponding to the extracted temperature section and a delay time corresponding to the charging/discharging state of the battery cell; a temperature deviation calculator configured to calculate a difference between a surface temperature corresponding to a previous time point by the delay time calculated by the delay time calculator and a current surface temperature, based on a current time point; and an actual cell surface temperature estimator configured to estimate a current surface temperature plus the temperature deviation calculated by the temperature deviation calculator as the surface temperature to be measured after the delay time at the time point.

At this time, the cell surface temperature predictor predicts the surface temperature estimated by the actual cell surface temperature estimator as the actual cell surface temperature of the battery cell.

Moreover, the data on the delay time corresponding to each charge/discharge state of the battery cell for each predetermined temperature section stored in the first memory is updated every time the battery cell is charged/discharged.

Furthermore, the battery cell surface temperature estimation system further includes a temperature state analyzer configured to compare the actual cell surface temperature predicted by the actual cell surface temperature predictor with a predetermined reference value, and diagnose the temperature state of the battery cell according to a comparison result.

A battery cell surface temperature estimation method according to the present invention includes: a temperature measurement step of measuring a surface temperature of a battery cell being charged/discharged at a predetermined cycle interval; a delay time acquisition step of acquiring a delay time required for the surface temperature measured in the temperature measurement step to reach a maximum temperature for each predetermined temperature section from a charge/discharge end time point of the battery cell; a database provision step of storing the delay time corresponding to each charge/discharge state of the battery cell for each predetermined temperature section into a database based on the data on the delay time for each predetermined temperature section obtained through the temperature measurement step and the delay time acquisition step; and a cell surface temperature prediction step of calculating a delay time corresponding to the measured cell surface temperature of the battery cell based on the database obtained in the database provision step and predicting an actual cell surface temperature that is an actual temperature value of the battery cell, using the calculated delay time.

In detail, the cell surface temperature prediction step includes: a current delay time calculation step of extracting a temperature section to which the surface temperature belongs among a predetermined temperature section of the database, and calculating a delay time corresponding to the measured cell surface temperature of the battery cell by using the temperature value corresponding to the extracted temperature section and the delay time corresponding to the charge/discharge state of the battery cell; a temperature deviation calculation step of calculating a difference between the surface temperature value corresponding to the previous time point by the delay time calculated in the delay time calculation step based on the time point and a current surface temperature value; and an actual cell surface temperature estimation step of estimating a current surface temperature and the temperature deviation calculated in the temperature deviation calculation step as the surface temperature to be measured after the delay time at the time point.

At this time, the cell surface temperature prediction step predicts the surface temperature value estimated in the actual cell surface temperature estimation step as the actual cell surface temperature of the battery cell.

Moreover, the battery cell surface temperature estimation method further includes a temperature state diagnosis step of comparing the actual cell surface temperature predicted in the cell surface temperature predictor with a predetermined reference value, and diagnosing the temperature state of the battery cell according to a comparison result.

Furthermore, the data on the delay time corresponding to each charge/discharge state of the battery cell for each predetermined temperature section stored in the database is updated every time the battery cell is charged/discharged.

Advantageous Effects

The present invention estimates the measurement delay time based on the current measurement temperature by reflecting the measurement temperature change gradient of the battery cell, and predicts the value estimated as the temperature after the measurement delay time based on the present as the current actual cell surface temperature. Therefore, the temperature of the battery cells may be monitored with improved accuracy in real time by minimizing the measurement delay that occurs when measuring the temperature of the battery cell in a physical way.

Due to this, since it is possible to diagnose the temperature state of the battery cell more accurately and quickly, battery stability may be improved.

MODE FOR CARRYING OUT THE INVENTION

Figure 1:
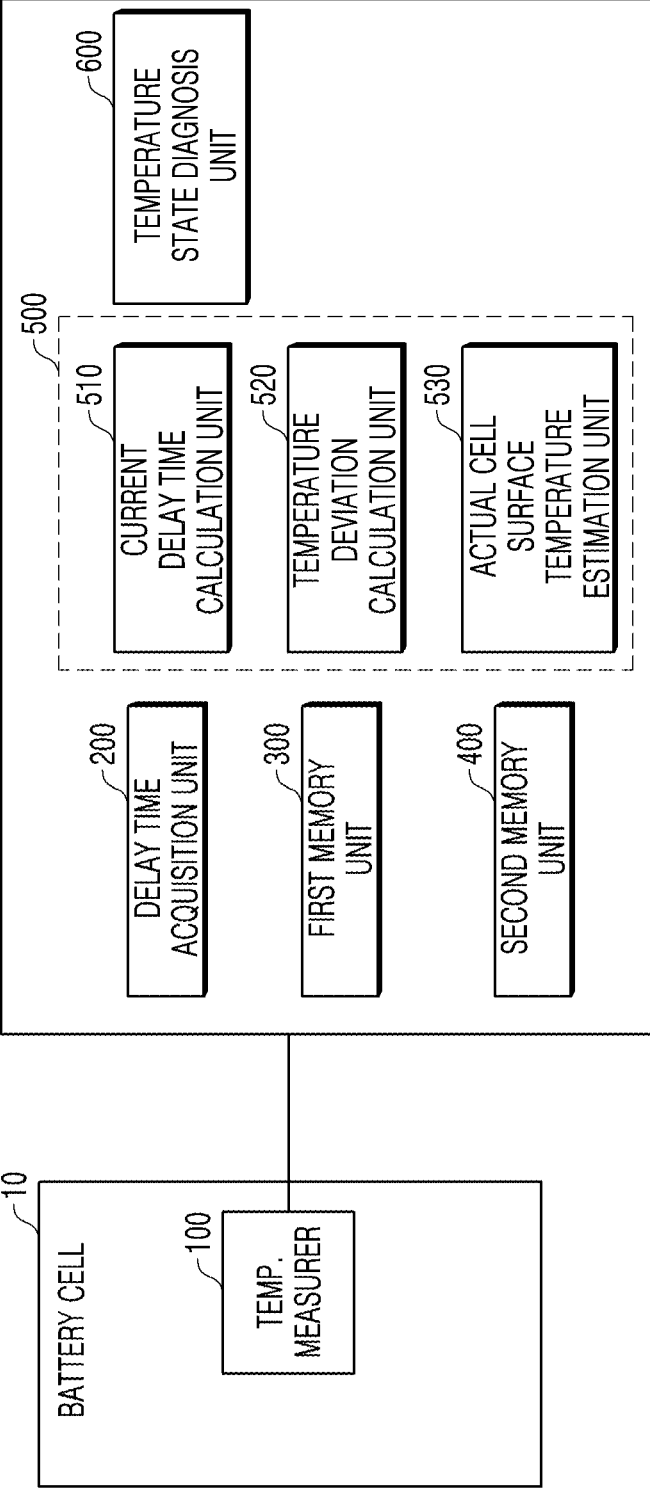
FIG. 1 is a block diagram schematically showing the overall configuration of a battery cell surface temperature estimation system according to the present invention.

Hereinafter, embodiments of the present invention will be described in detail with reference to the accompanying drawings so that those of ordinary skill in the art may easily implement the present invention. However, the present invention may be implemented in various forms and is not limited to the embodiments described herein. In the drawings, parts irrelevant to the description are omitted in order to clearly describe the present invention, and like reference numerals refer to like elements throughout the specification.

Hereinafter, the present invention will be described in detail with reference to the drawings.

1. Battery Cell Surface Temperature Estimation System According to Present Invention FIG. 1 is a block diagram schematically showing the overall configuration of a battery cell surface temperature estimation system according to the present invention. The system of the present invention includes a temperature measurement unit 100, a delay time acquisition unit 200, a first memory unit 300, a second memory unit 400, an actual cell surface temperature prediction unit 500, and a temperature state diagnosis unit 600.

1.1. Temperature Measurement Unit 100

The temperature measurement unit is a configuration that measures the temperature of the battery cell 10 being charged/discharged at a predetermined cycle interval, and specifically, is provided at a predetermined position among the surface of the battery cell 10 to measure the cell surface temperature. Hereinafter, the temperature of the battery cell measured by such a temperature measurement unit will be referred to as a measurement cell surface temperature and described.

1.2. Delay Time Acquisition Unit 200

The delay time acquisition unit is a configuration that measures and acquires the delay time, which is the time it takes from the charge/discharge end time point of the battery cell until the measurement cell surface temperature measured by the temperature measurement unit 100 reaches the maximum temperature for each predetermined temperature section.

For example, if the temperature section is set at 10 degree intervals and the measurement cell surface temperature at the charge/discharge end time point is about 25 degrees, the time it takes for the measurement cell surface temperature to reach 30 degrees, that is, the highest temperature in the section of 20 degrees to 30 degrees, from that point, the time it takes to reach the maximum temperature of 40 degrees in the section of 30 degrees to 40 degrees, the time it takes to reach the maximum temperature of 50 degrees in the section of 40 degrees to 50 degrees, and the time it takes to reach the maximum temperature of 60 degrees in the section of 50 degrees to 60 degrees are measured, and the time acquired for each temperature section at this time is the delay time.

That is, the delay time means the time difference between the charge/discharge end time point and the time when the measurement cell surface temperature reaches the maximum temperature of the corresponding temperature section for each temperature section.

1.3. First Memory Unit 300

The first memory unit is a configuration that databases and stores the delay time corresponding to each charge/discharge state of the battery cell for each predetermined temperature section based on the data on the delay time acquired from the delay time acquisition unit 200 every time the battery cell is charged/discharged.

Figures 2, 3:
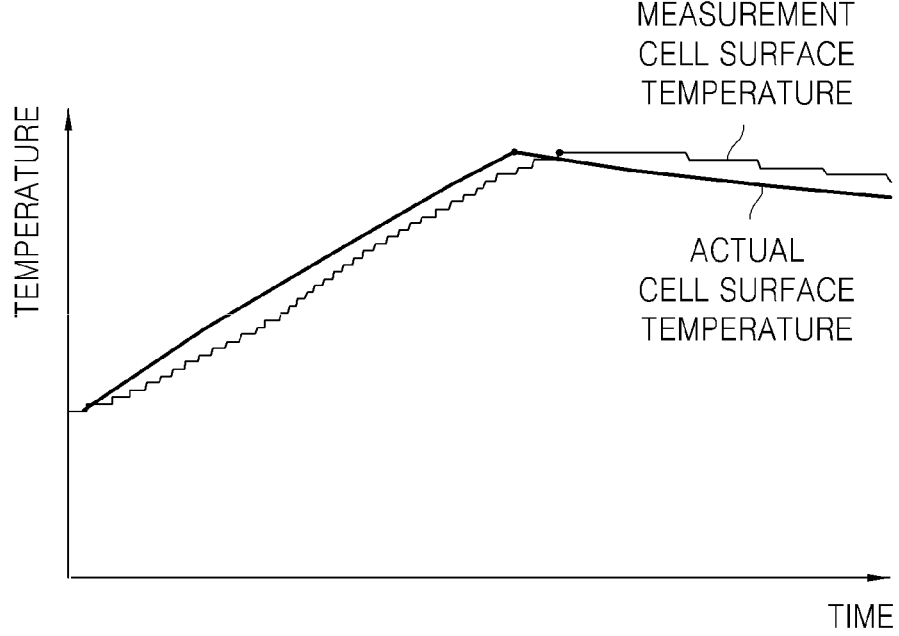
FIG. 2 is a graph showing an example of comparing the change state between the actual cell surface temperature and the measurement cell surface temperature.
FIG. 3 is a table showing an example of a database according to the present invention.

For example, as shown in the table of FIG. 3, charging delay time of 3 and discharging delay time of 3 at 30 degrees mean that it took 3 seconds from the end time point of charging of the battery cell until the measurement cell surface temperature reaches 30 degrees and it took 3 seconds from the end time point of discharging of the battery cell until the measurement cell surface temperature reaches 30 degrees.

The first memory unit forms a database and stores the delay time data for each charge/discharge state for each temperature section in such a table format.

Meanwhile, the first memory unit updates and stores the data obtained from the delay time acquisition unit 200 for every charge/discharge of the battery cell. Accordingly, since the most recent temperature change trend may be reflected in predicting the actual temperature of the battery cell, it is possible to predict the actual surface temperature of a battery cell with improved accuracy.

1.4. Second Memory Unit 400

The second memory unit is a configuration that stores the measurement cell surface temperature value measured at a predetermined period by the temperature measurement unit 100.

1.5. Cell Surface Temperature Prediction Unit 500

The cell surface temperature prediction unit is a configuration that calculates a delay time corresponding to the measurement cell surface temperature of the current time measured by the temperature measurement unit 100 based on the database of the first memory unit 300, and predicts the actual cell surface temperature at the current time by using the calculated delay time. This cell surface temperature prediction unit may include the following detailed configuration.

A. Current Delay Time Calculation Unit 510

The delay time calculation unit may extract a temperature section to which the current measurement cell surface temperature measured by the temperature measurement unit 100 belongs among the temperature sections stored in the first memory unit 300, and calculate the delay time corresponding to the current measurement cell surface temperature by using the temperature value corresponding to the extracted temperature section and the delay time corresponding to the charge/discharge state of the current battery cell.

Referring to FIG. 3 for an example, if the current battery cell is discharging and the current measurement cell surface temperature is 45 degrees, the temperature section to which the current measurement cell surface temperature belongs is a 40 to 50 degree section, and the delay times in the discharge state corresponding to the corresponding temperature values of 40 and 50 degrees respectively are 9 and 13. In this case, the delay time corresponding to the current measurement cell surface temperature may be calculated as about 11 seconds through the expression $\{(9+13)/2\}$.

In this way, the current delay time calculation unit may calculate the delay time corresponding to the current measurement cell surface temperature based on the database of the first memory unit 300.

The delay time calculated here is a time for which measurement in the temperature measurement unit 100 is delayed compared to the actual cell surface temperature state based on the present, and that is, means that the temperature measurement unit 100 is measuring slower than the actual cell surface temperature by the calculated delay time.

B. Temperature Deviation Calculation Unit 520

The temperature deviation calculation unit may calculate the difference between the measurement cell surface temperature value corresponding to the previous time point by the delay time calculated by the current delay time calculation unit 510 and the current measurement cell surface temperature value based on the current time point.

For example, if the delay time calculated by the current delay time calculation unit 510 is 11 seconds as described above, the difference between the measurement cell surface temperature value 11 seconds ago and the current measurement cell surface temperature value is calculated based on the current time point. If the measurement cell surface temperature value 11 seconds ago was 40 degrees, 5 degrees, which is a difference from the current measurement cell surface temperature value of 45 degrees, is calculated.

D. Actual Cell Surface Temperature Estimation Unit 530

The actual cell surface temperature estimation unit estimates a value obtained by adding the temperature deviation value calculated by the temperature deviation calculation unit 520 to the current measurement cell surface temperature value as the corresponding measurement cell surface temperature after the delay time, and predicts this as the current actual cell surface temperature.

For example, if the current measurement cell surface temperature is 45 degrees, the delay time calculated by the current delay time calculation unit 510 is 11 seconds, and the temperature deviation calculated by the temperature deviation calculation unit 520 is 5 degrees, the measurement cell surface temperature value to be measured in the temperature measurement unit 100 after 11 seconds from the current time point is estimated as 50 degrees, which is a value obtained by adding 45 degrees to 5 degrees, and is predicted as the current actual cell surface temperature. Since the measurement cell surface temperature is delayed by 11 seconds compared to the actual cell surface temperature, under the assumption that the same fluctuation will continue after 11 seconds by the difference between the measurement cell surface temperature 11 seconds before and the current measurement cell surface temperature based on the present, a value obtained by adding the temperature difference to the current measurement cell surface temperature is estimated as the measurement cell surface temperature to be measured after 11 seconds, and this is predicted as the actual cell surface temperature.

The reason is that although the temperature sensor measuring the cell surface is in contact with the cell surface, a time difference occurs due to contact design, conduction, and the like, and as shown in the graph of FIG. 2, the temperature is measured slower than the actual cell surface temperature. Accordingly, for example, a difference occurs in the time point showing the highest temperature at the end of the discharge, and if the actual cell surface temperature decreases immediately after the discharge ends, the measurement cell surface temperature shows the highest temperature after the delay time after the end of the discharge and then decreases.

Therefore, the present invention calculates the current measurement delay time by using a change in the temperature of the battery cells and a difference in time when the maximum temperature is measured after the end of charging/discharging, and reflects this and estimates the actual cell surface temperature at the current time point to improve its accuracy. Accordingly, it is possible to prevent a problem of delay in diagnosing the temperature state of the battery cell caused by the measurement delay.

1.6. Temperature State Diagnosis Unit 600

When the current actual cell surface temperature is predicted by the cell surface temperature prediction unit 500, the temperature state diagnosis unit compares this with a predetermined reference value and diagnoses the current temperature state of the battery cell according to the comparison result. The temperature state diagnosis unit may diagnose the current temperature state of the battery cell using a conventional method.

Figure 4:
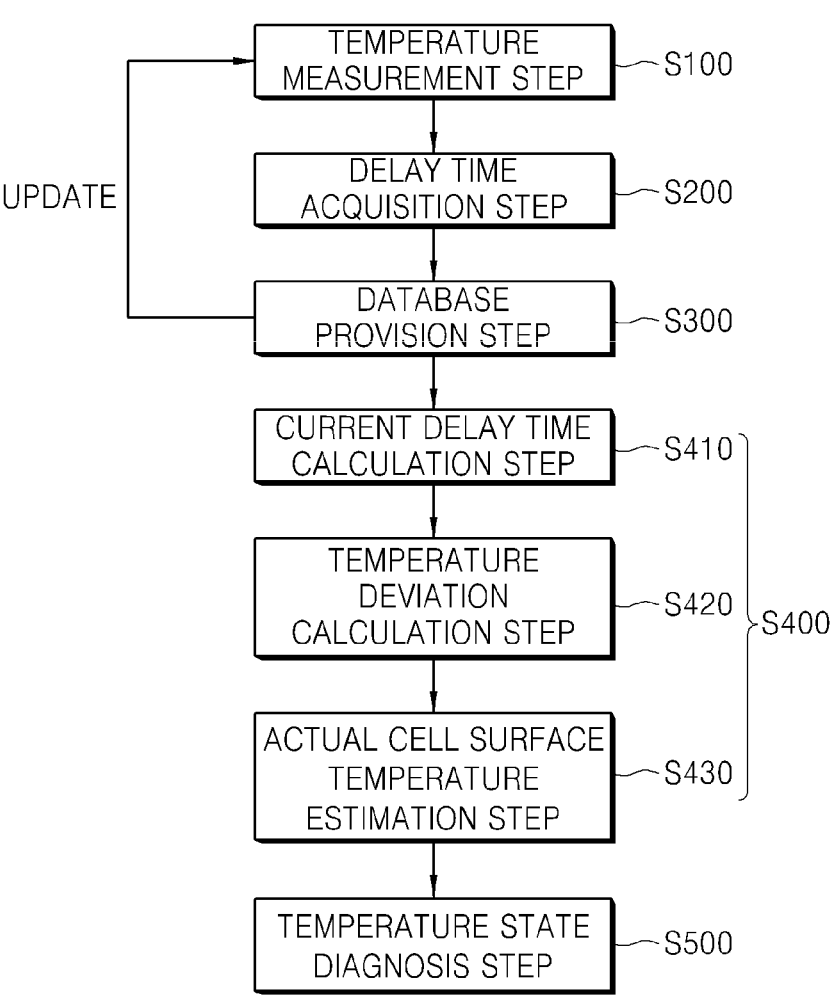
FIG. 4 is a flowchart illustrating a method for estimating a battery cell surface temperature according to the present invention.

2. Battery Cell Surface Temperature Estimation Method According to Present Invention FIG. 4 is a flowchart illustrating a method for estimating a battery cell surface temperature according to the present invention. With reference to this, each step will be described.

2.1. Temperature Measurement Step S100

The temperature measurement step is a step of measuring a measurement cell surface temperature, which is a temperature value of a battery cell being charged/discharged, at a predetermined cycle interval, and is performed by the temperature measurement unit 100 provided at a predetermined position on the surface of the battery cell.

2.2. Delay Time Acquisition Step S200

The delay time acquisition step is a step of measuring and acquiring the delay time, which is the time it takes from the charge/discharge end time point of the battery cell until the measurement cell surface temperature measured in the temperature measurement step S100 reaches the maximum temperature for each predetermined temperature section. This step is made by the delay time acquisition unit 200, and since it has been described above, a detailed description thereof will be omitted.

2.3. Database Provision Step S300

The database provision step is a step of storing the delay time corresponding to each charge/discharge state in a database for each predetermined temperature section based on the data on the delay time for each predetermined temperature section obtained through the temperature measurement step S100 and the delay time acquisition step S200.

Specifically, data on the delay time for each predetermined temperature section obtained is accumulated and learned by repeatedly performing the delay time acquisition step (S200) every time the battery cell is charged/discharged, so that for example, as shown in the table of FIG. 3, a database including a delay time corresponding to each charge/discharge state for each predetermined temperature section may be provided.

At this time, the data included in the database, that is, the delay time value for each charge/discharge state for each predetermined temperature section, is updated according to the data on the delay time for each charge/discharge of the battery cell to reflect the real-time temperature state of the battery cell through the temperature measurement step S100 and the delay time acquisition step S200.

2.4. Cell Surface Temperature Prediction Step S400

The cell surface temperature prediction step is a step of calculating the delay time corresponding to the current measurement cell surface temperature, based on the database obtained in the database provision step, and predicting the actual cell surface temperature, which is the actual temperature value of the current battery cell, using the calculated delay time, and may include the following steps.

A. Current Delay Time Calculation Step S410

First, the temperature section to which the current measurement cell surface temperature belongs is extracted from among the temperature sections stored in the database, and the delay time corresponding to the current measurement cell surface temperature is calculated using the temperature value corresponding to the extracted temperature section and the delay time corresponding to the charge/discharge state of the current battery cell.

Referring to FIG. 3 for an example, if the current battery cell is discharging and the current measurement cell surface temperature is 45 degrees, the temperature section to which the current measurement cell surface temperature belongs is a 40 to 50 degree section, and the delay times in the discharge state corresponding to the corresponding temperature values of 40 degrees and 50 degrees respectively are 9 and 13. In this case, the delay time corresponding to the current measurement cell surface temperature can be calculated as about 11 seconds through the expression $\{(9+13)/2\}$.

In this way, the delay time corresponding to the current measurement cell surface temperature can be calculated based on the database.

The delay time calculated here is the delay time for measurement in the temperature sensor compared to the actual cell surface temperature state based on the present, and that is, means that the temperature measurement unit 100 is measuring slower than the actual cell surface temperature by the calculated delay time.

B. Temperature Deviation Calculation Step S420

When the delay time at the current time point is calculated through the current delay time calculation step S410, a difference between the measurement cell surface temperature value corresponding to the previous time point by the calculated delay time and the current measurement cell surface temperature value is calculated based on the current time point.

For example, if the delay time calculated in the current delay time calculation step S410 is 11 seconds, a difference between the measurement cell surface temperature value 11 seconds ago and the current measurement cell surface temperature value is calculated based on the current time point. If the measurement cell surface temperature 11 seconds ago is 40 degrees and the current measurement cell surface temperature is 45 degrees, the difference between them, that is, 5 degrees, is calculated.

C. Actual Cell Surface Temperature Estimation Step S430

The actual cell surface temperature estimation step is, if the difference between the measurement cell surface temperature before the current delay time and the current measurement cell surface temperature is calculated, to estimate the measurement cell surface temperature to be measured after the delay time based on the present using this, and predict the estimated temperature as the current actual cell surface temperature.

For example, if the current measurement cell surface temperature is 45 degrees, the current delay time is 11 seconds, and the difference between the measurement cell surface temperature before 11 seconds and the current measurement cell surface temperature is 5 degrees, the measurement cell surface temperature to be measured 11 seconds later from the current time point is estimated to be 50 degrees, which is a value of 45 degrees plus 5 degrees, and this is predicted as the current actual cell surface temperature. Since the measurement cell surface temperature is delayed by 11 seconds compared to the actual cell surface temperature, under the assumption that the same fluctuation will continue after 11 seconds by the difference between the temperature of the measurement cell surface temperature 11 seconds before and the current measurement cell surface based on the present, the current measurement cell surface temperature plus the temperature difference between the past and present is estimated as the measurement cell surface temperature to be measured after 11 seconds, and this is predicted as the actual cell surface temperature.

2.5. Temperature State Diagnosis Step S500

The temperature state diagnosis step is a step of comparing the temperature value predicted as the current actual cell surface temperature through the cell surface temperature prediction step S400 with a predetermined reference value and diagnosing the current temperature state of the battery cell according to the comparison result, which may diagnose the current temperature state of the battery cell using a conventional method.

On the other hand, although the technical idea of the present invention has been specifically described according to the above embodiment, it should be noted that the above embodiments are for the purpose of explanation and not limitation. In addition, those skilled in the art in the technical field of the present invention will be able to understand that various embodiments are possible within the scope of the spirit of the present invention.

The invention claimed is:

1. A battery cell surface temperature estimation control system comprising:

a temperature measurer configured to measure a surface temperature of a battery cell being charged/discharged at a predetermined cycle interval;

a delay time acquirer configured to acquire a delay time needed for the surface temperature to reach a maximum temperature for each predetermined temperature section from a charge/discharge end time point of the battery cell;

a first memory configured to store the delay time acquired by the delay time acquirer corresponding to each charge/discharge state of the battery cell for each predetermined temperature section as a database based on data including the delay time obtained from the delay time acquirer;

a second memory configured to store the surface temperature measured by the temperature measurer; and a cell surface temperature predictor configured to calculate a delay time corresponding to the surface temperature measured by the temperature measurer based on the database of the first memory, and predict an actual cell surface temperature of the battery cell, based on a change in a measurement cell surface temperature over the calculated delay time by the cell surface temperature predictor, wherein a charging or discharging of the battery cell is controlled based on the predicted actual cell surface temperature.

2. The battery cell surface temperature estimation control system of claim 1, wherein the cell surface temperature predictor comprises:

a current delay time calculator configured to extract a temperature section to which the surface temperature measured by the temperature measurer belongs from among the predetermined temperature sections stored in the first memory, and calculate a delay time corresponding to the surface temperature by using a temperature value corresponding to the extracted temperature section and the delay time acquired by the delay time acquirer corresponding to the charge/discharge state of the battery cell;

a temperature deviation calculator configured to calculate a difference between a surface temperature value corresponding to a previous time point by the delay time calculated by the current delay time calculator and a current surface temperature value, based on a current time point; and an actual cell surface temperature estimator configured to estimate a current surface temperature and the temperature difference calculated by the temperature deviation calculator as the surface temperature to be measured after the delay time calculated by the current delay time calculator at the current time point.

3. The battery cell surface temperature estimation control system of claim 2, wherein the cell surface temperature predictor predicts the surface temperature value estimated by the actual cell surface temperature estimator as the current actual cell surface temperature of the battery cell.

4. The battery cell surface temperature estimation control system of claim 3, further comprising a temperature state analyzer configured to compare the actual cell surface temperature predicted by the actual cell surface temperature estimator with a predetermined reference value, and diagnose a current temperature state of the battery cell according to a comparison result.

5. The battery cell surface temperature estimation control system of claim 1, wherein the data on the delay time acquired by the delay time acquirer corresponding to each charge/discharge state of the battery cell for each predetermined temperature section stored in the first memory is updated every time the battery cell is charged/discharged.

6. The battery cell surface temperature estimation control system of claim 1, wherein the first memory is configured to store a charging delay time and a discharging delay time for each predetermined temperature section.

7. A battery cell surface temperature estimation and control method comprising:

a temperature measurement step of measuring a surface temperature that is a surface temperature of a battery cell being charged/discharged at a predetermined cycle interval;

a delay time acquisition step of acquiring a delay time, by a delay time acquirer, needed for the surface temperature measured in the temperature measurement step to reach a maximum temperature for each predetermined temperature section from a charge/discharge end time point of the battery cell;

a database provision step of storing the delay time acquired by the delay time acquirer corresponding to each charge/discharge state of the battery cell for each predetermined temperature section into a database based on data on the delay time acquired by the delay time acquirer for each predetermined temperature section obtained through the temperature measurement step and the delay time acquisition step;

a cell surface temperature prediction step of calculating a delay time, by a cell surface temperature predictor, corresponding to the measured cell surface temperature of the battery cell based on the database obtained in the database provision step and predicting an actual cell surface temperature that is an actual temperature value of the battery cell, based on a change in a measurement cell surface temperature over the calculated delay time by the cell surface temperature predictor; and controlling a charging or discharging of the battery cell based on the predicted actual cell surface temperature.

8. The battery cell surface temperature estimation and control method of claim 7, wherein the cell surface temperature prediction step comprises:

a current delay time calculation step of extracting, by a current delay time calculator, a temperature section to which the surface temperature belongs among a predetermined temperature section of the database, and calculating a delay time corresponding to the current measured cell surface temperature of the battery cell by using a temperature value corresponding to the extracted temperature section and the delay time acquired by the delay time acquirer corresponding to the charge/discharge state of the battery cell;

a temperature deviation calculation step of calculating a difference between a surface temperature value corresponding to a previous time point by the delay time calculated by the current delay time calculator in the current delay time calculation step based on a current time point and a current surface temperature value; and an actual cell surface temperature estimation step of estimating a current surface temperature and the temperature deviation calculated in the temperature deviation calculation step as the surface temperature to be measured after the delay time calculated by the current delay time calculator at the current time point.

9. The battery cell surface temperature estimation and control method of claim 8, wherein the cell surface temperature prediction step predicts the surface temperature estimated in the actual cell surface temperature estimation step as an actual cell surface temperature of the battery cell.

10. The battery cell surface temperature estimation and control method of claim 9, further comprising a temperature state diagnosis step of comparing the actual cell surface temperature predicted in the cell surface temperature estimation step with a predetermined reference value, and diagnosing a temperature state of the battery cell according to a comparison result.

11. The battery cell surface temperature estimation and control method of claim 7, wherein the data on the delay time acquired by the delay time acquirer corresponding to each charge/discharge state of the battery cell for each predetermined temperature section stored in the database is updated every time the battery cell is charged/discharged.

* * * * *